(12) United States Patent
Terui

(10) Patent No.: US 6,952,048 B2
(45) Date of Patent: Oct. 4, 2005

(54) SEMICONDUCTOR DEVICE WITH IMPROVED DESIGN FREEDOM OF EXTERNAL TERMINAL

(75) Inventor: Makoto Terui, Yamanashi (JP)

(73) Assignee: Oki Electric Industry Co., Ltd., Tokyo (JP)

(*) Notice: Subject to any disclaimer, the term of this patent is extended or adjusted under 35 U.S.C. 154(b) by 71 days.

(21) Appl. No.: 10/722,559

(22) Filed: Nov. 28, 2003

(65) Prior Publication Data

US 2005/0006760 A1 Jan. 13, 2005

(30) Foreign Application Priority Data

Jul. 8, 2003 (JP) .................................... 2003/193261

(51) Int. Cl.[7] .............................................. H01L 23/02
(52) U.S. Cl. .................... 257/678; 257/690; 257/734
(58) Field of Search ............................... 257/678, 690, 257/734, 780

(56) References Cited

U.S. PATENT DOCUMENTS

| 4,799,128 | A | * | 1/1989 | Chen ........................... 361/795 |
| 6,228,684 | B1 | | 5/2001 | Maruyama |
| 6,391,685 | B1 | | 5/2002 | Hikita et al. |
| 6,433,422 | B1 | | 8/2002 | Yamasaki |
| 6,600,234 | B2 | * | 7/2003 | Kuwabara et al. ........... 257/790 |
| 6,770,971 | B2 | * | 8/2004 | Kouno et al. ................. 257/734 |
| 2002/0149086 | A1 | | 10/2002 | Aoki |
| 2003/0080409 | A1 | * | 5/2003 | Nakamura et al. ........... 257/700 |
| 2003/0189251 | A1 | | 10/2003 | Terui et al. |
| 2003/0218246 | A1 | * | 11/2003 | Abe et al. .................... 257/734 |

FOREIGN PATENT DOCUMENTS

| JP | 09-064049 | 3/1997 |
| JP | 2000-243900 | 9/2000 |
| JP | 2000-299406 | 10/2000 |

* cited by examiner

Primary Examiner—T. N. Quach
(74) Attorney, Agent, or Firm—Rabin & Berdo, P.C.

(57) ABSTRACT

A semiconductor device comprises; a semiconductor substrate having a first region and a second region; a plurality of first sub-external terminals disposed on the first region; a plurality of second sub-external terminals composed of terminals to be grounded and terminals to be connected to a power source; a plurality of second external terminals disposed on the second region; a first sub-wiring structure provided on the first region for electrically connecting the plurality of first sub-external terminals and a plurality of circuit element connecting pads; a second sub-wiring structure for electrically connecting the plurality of second sub-external terminals and the plurality of circuit element connecting pads; and a plurality of second wiring structures provided from the first region to the second region for electrically connecting the plurality of second external terminals and the plurality of circuit element connecting pads.

14 Claims, 10 Drawing Sheets

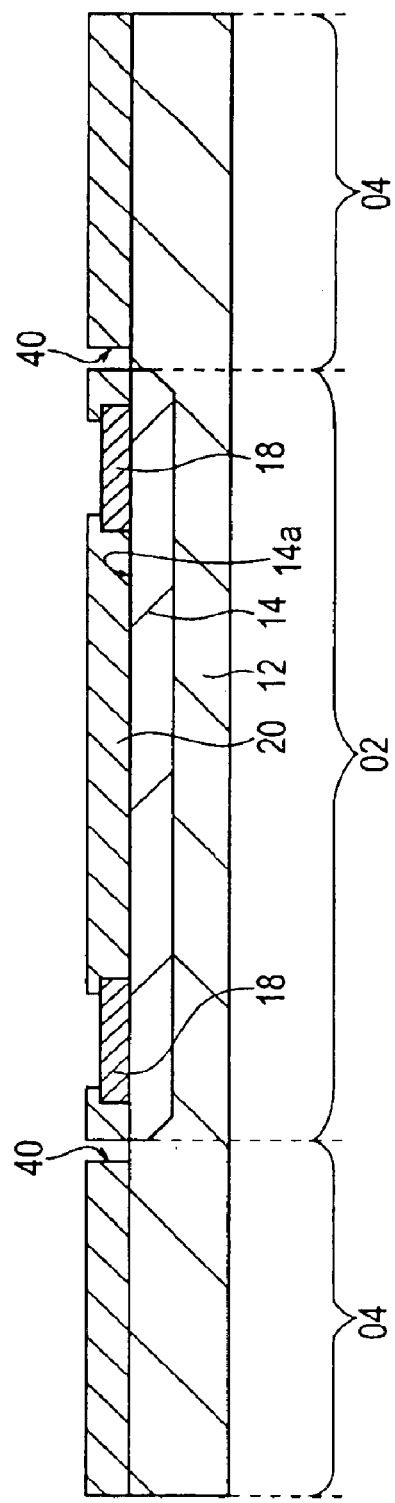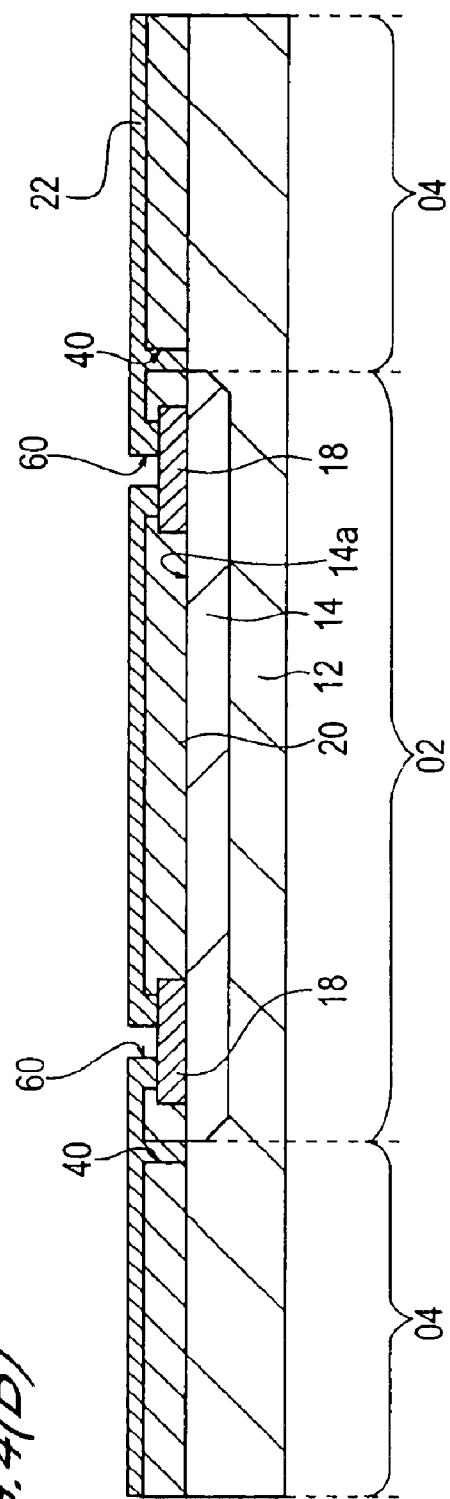

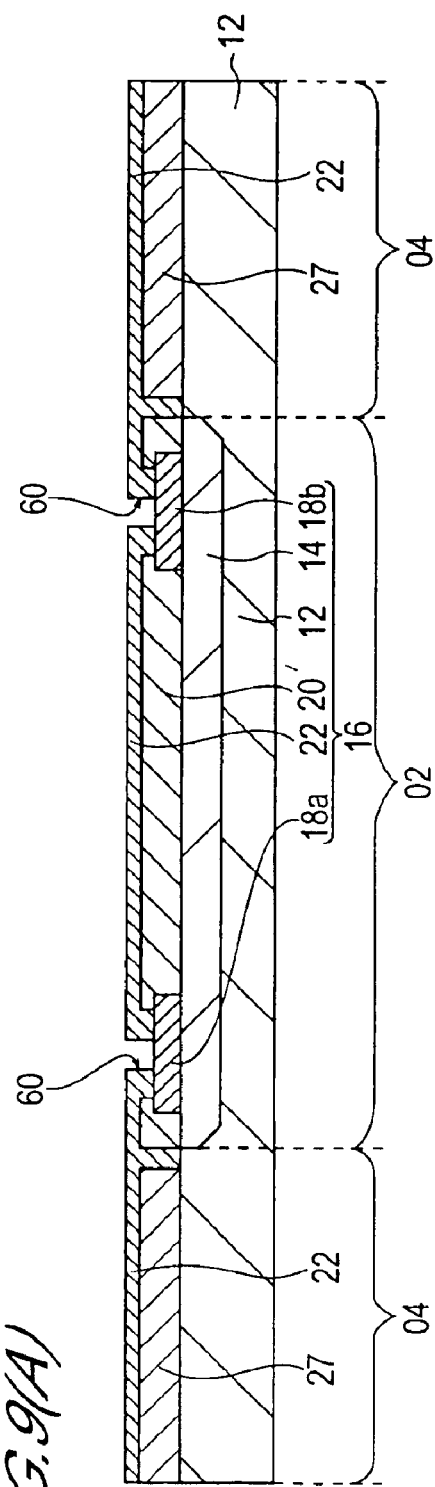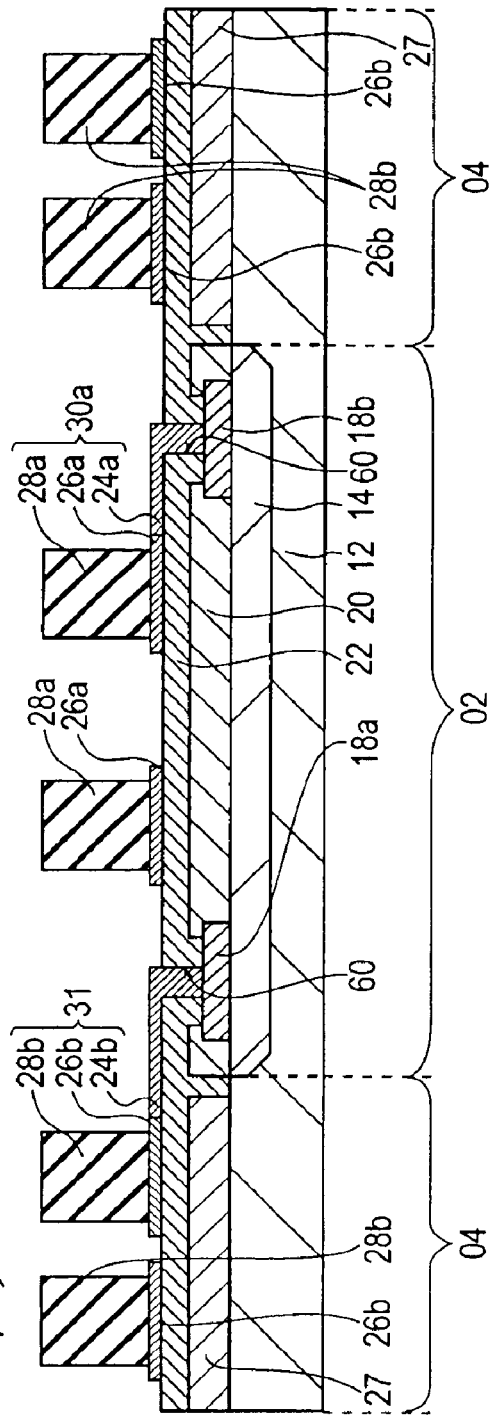
FIG. 9(A)
FIG. 9(B)

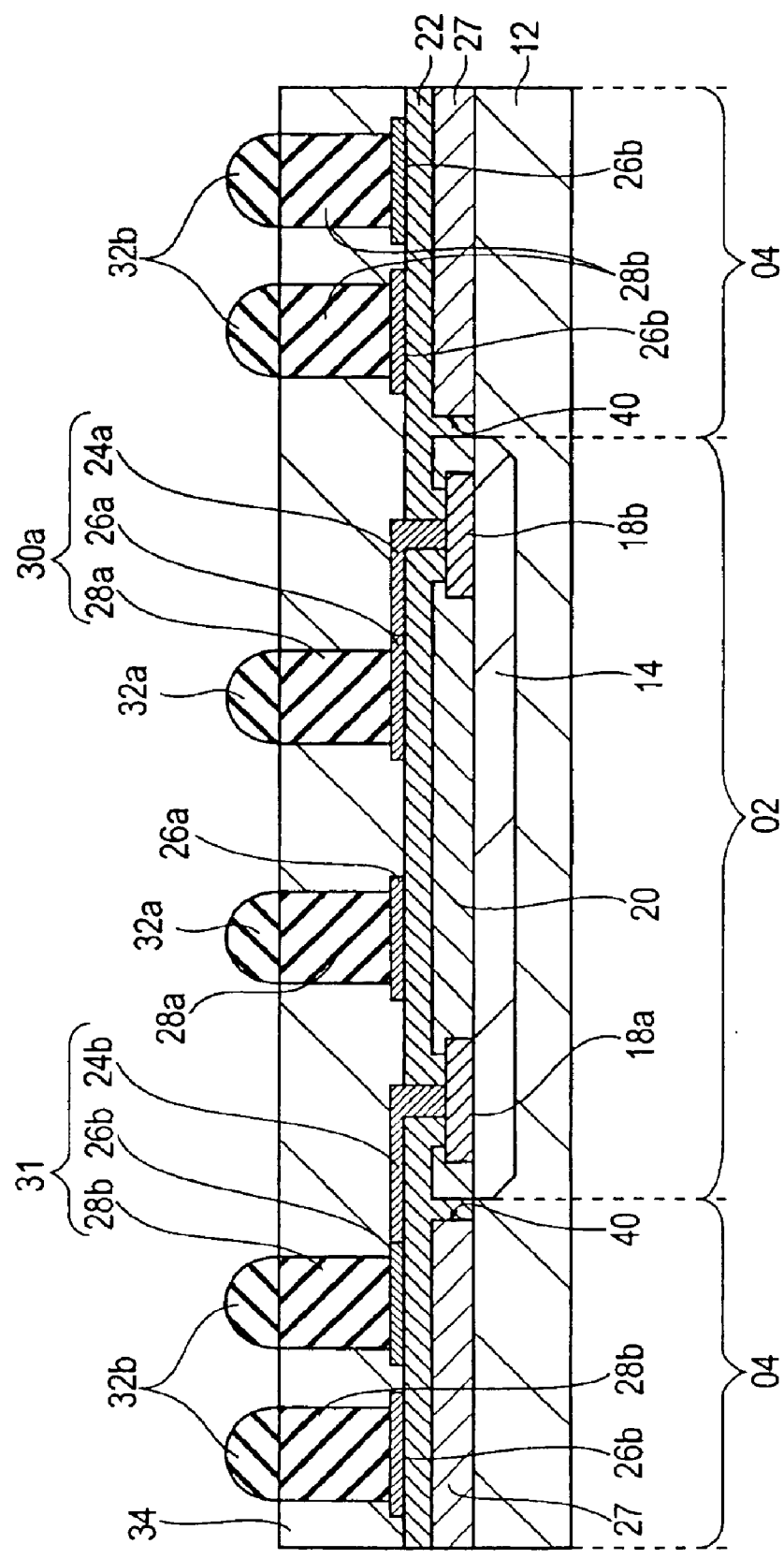

SEMICONDUCTOR DEVICE WITH IMPROVED DESIGN FREEDOM OF EXTERNAL TERMINAL

BACKGROUND OF THE INVENTION

1. Field of the Invention

The present invention relates to a semiconductor device and a manufacturing method thereof, and more particularly to a semiconductor device having a constitution which is capable of corresponding to further increases in the number of external terminals and a manufacturing method thereof.

2. Description of Related Art

A package of an equal size to a semiconductor chip cut from a semiconductor wafer is generally known as a CSP (Chip Size Package). Further, a CSP obtained when a semiconductor chip formed on a semiconductor wafer is packaged in the form of the original semiconductor wafer is known as a WCSP.

In Japanese Unexamined Patent Application Publication 2000-299406, a semiconductor device which is formed as a CSP and constituted to prevent warping generated from a wiring layer and metal posts formed on an IC circuit and changes in the characteristic of the IC circuit generated by heat and stress received from the soldering is disclosed.

This semiconductor device comprises a wiring layer having Cu as its main material which is connected to pads made of a metallic material and extends over the chip surface. Metal posts are formed in one region of the wiring layer. An insulating resin layer which covers the chip surface, including the wiring layer, is provided such that the surface of the metal posts protrudes therefrom.

The metal posts are positioned outside of an electrode pad group and the region surrounded by the electrode pad group. Solder bumps or solder balls are fixed onto the metal posts. The solder bumps or solder balls are formed on the periphery of the chip.

The number of external terminals provided on the mounting face of the semiconductor device, or in other words the pin count, is determined according to the size of the mounting face and the pitch of the external terminals (the distance between two adjacent terminals) The number of pins on the mounting face increases as the size of the mounting face increases or as the pitch of the external terminals decreases. Increasing the number of pins on the mounting face in this manner is known as increasing the pin count.

In general, the pitch of the external terminals is specified on the side of the user who is to use the semiconductor device. Hence even if the external terminal pitch of the semiconductor device is reduced with the size of the mounting face remaining at a fixed size such that the pin count is increased, and the semiconductor device is provided to a user with the pin count thus increased, circumstances may arise in which the provided semiconductor device cannot be used on the user side. Moreover, when the external terminal pitch is reduced with the size of the mounting face remaining at a fixed size, the pin count that can be realized when the pin count is increased is limited.

Alternatively, increasing the size of the mounting face while keeping the external terminal pitch at a fixed value has been considered as a method of realizing a high pin count. In the case of a semiconductor device having a WCSP constitution, the size of the semiconductor chip surface and the size of the mounting face are equal. Hence if the size of the mounting face is increased in a semiconductor device having a WCSP constitution, the size of the semiconductor chip surface is also increased.

The semiconductor chip comprises a circuit element. As is well-known, this circuit element is provided to perform a desired electrical operation in accordance with the design, for example to serve as an integrated circuit. Modifying the design of the circuit element formed on the semiconductor chip has been considered in order to increase the size of the semiconductor chip surface. However, if the design of the circuit element is modified, the manufacturing cost of the semiconductor chip rises.

If the size of the semiconductor chip surface is increased without modifying the design of the circuit element, the semiconductor chip can only be used in the packaging of a WCSP constitution having the target mounting face size, and packaging constitutions other than this WCSP constitution cannot be applied to the semiconductor chip. In this case also, rises in the manufacturing cost of the semiconductor chip are inevitable.

Hence, to realize a high pin count by increasing the size of the mounting face with the external terminal pitch remaining at a fixed value, a packaging constitution other than a WCSP must be applied to the semiconductor chip in other words, according to a conventional semiconductor device having a WCSP constitution, the problems described above make the realization of a high pin count difficult.

An object of this invention is to provide a semiconductor device having a WCSP constitution in which a high pin count can be realized easily by increasing the size of the mounting face, and a manufacturing method therefor.

A further object of this invention is to increase the operational stability of a semiconductor device having such a constitution by providing a semiconductor device having one or both of a constitution which is capable of reducing power source inductance caused by power bounce and a constitution which is suitable for high speed signal transmission, and a manufacturing method therefor.

SUMMARY OF THE INVENTION

In order to achieve these objects, a semiconductor device of this invention comprises the following constitutional features.

The semiconductor device comprises a semiconductor substrate. A circuit element forming region of the semiconductor substrate is a first region, and a plurality of circuit elements is formed in the first region.

A plurality of circuit element connecting pads is connected to the circuit element via a multi-layer wiring structure, for example. The semiconductor substrate includes a second region provided so as to surround the periphery of the first region.

A plurality of first sub-external terminals composed of terminals to be grounded and terminals to be connected to a power source is disposed on the first region of the semiconductor substrate. A second sub-external terminal is also disposed on the first region. The first sub-external terminal and second sub-external terminal will also be referred to together as a first external terminal.

A plurality of second external terminals is disposed on the second region of the semiconductor substrate.

A first sub-wiring structure is provided on the first region s for electrically connecting the plurality of first sub-external terminals and the plurality of circuit element connecting pads.

A second sub-wiring structure is provided on the first region for electrically connecting the plurality of second sub-external terminals and the plurality of circuit element connecting pads.

A plurality of second wiring structures is provided from the first region to the second region for electrically connecting the plurality of second external terminals and the plurality of circuit element connecting pads.

According to the semiconductor device of this invention, the plurality of first external terminals is disposed on a mounting face of an equal size to the first region, and the plurality of second external terminals is disposed on a mounting face of an equal size to the second region. Hence external terminals may be provided on the second region in addition to the first region, whereby both the first region and second region can be used as mounting faces.

In other words, when the pin count is to be increased, a plurality of the second external terminals can be disposed on the second region according to the constitution of the semiconductor device of this invention when it is difficult to achieve a target pin count by simply disposing a plurality of the first external terminals on a mounting face of an equal size to the first region. In the semiconductor device of this invention, the second region is provided in relation to the first region such that the mounting face is of a sufficient size to achieve the target pin count.

The wiring configuration of the wiring structures that are electrically connected to the circuit element connecting pads in the first region will be referred to as a fan-in configuration below. As opposed to this fan-in configuration, the wiring configuration of the wiring structures that are electrically connected to the circuit element connecting pads from the first region to the second region will be referred to as a fan-out configuration.

Hence according to the semiconductor device of this invention, by providing the second region in addition to the first region, which serves as the circuit element forming region, the mounting face can be set to a desired size without altering the design of the circuit element itself. Further, by providing external terminals on a mounting face of this size, a target pin count can be achieved without narrowing the pitch of the pins. As a result, a high pin count can be realized.

According to the semiconductor device of this invention constituted as described above, the mounting face can be set to a desired size, and hence a high pin count can be realized with the pitch of the external terminals set in accordance with the desires of the user who is to use the semiconductor device.

Moreover, in order to stabilize operations of the semiconductor device constituted as described above, the semiconductor device of this invention is constituted to be capable of reducing power source inductance caused by power bounce, and hence malfunctions of the semiconductor device can be effectively prevented in addition to the effect of improving the design freedom of the external terminals.

Further, the semiconductor device of this invention has a constitution which is suitable for high-speed signal transmission, and hence the functional sophistication of the semiconductor device can be improved in addition to the effect of improving the design freedom of the external terminals.

Upon implementation of this invention, a manufacturing method preferably comprises the following manufacturing processes.

A manufacturing method for a semiconductor device comprises the steps of:

(a) setting a plurality of circuit element forming regions on a semiconductor substrate;

(b) forming a circuit element and a plurality of circuit element connecting pads connected to this circuit element on the circuit element forming region;

(c) setting a first region on which the circuit element and the plurality of circuit element connecting pads are provided, and a second region surrounding the periphery of the first region;

(d) forming an insulating film such that a part of the circuit element connecting pads is exposed;

(e) forming on the insulating film of the first region a plurality of first sub-wiring structures which are electrically connected to the circuit element connecting pads to be grounded and the circuit element connecting pads to be connected to a power source from among the plurality of circuit element connecting pads;

(f) forming on the insulating film of the first region a plurality of second sub-wiring structures which are electrically connected to the plurality of circuit element connecting pads;

(g) forming on the insulating film from the first region to the second region a plurality of second wiring structures which are electrically connected to the plurality of circuit element connecting pads;

(h) forming a sealing portion on the insulating film such that the first sub-wiring structures, second sub-wiring structures, and second wiring structures are partially exposed;

(i) forming on the first region a plurality of first sub-external terminals which are electrically connected to the plurality of first sub-wiring structures, and a plurality of second sub-external terminals which are electrically connected to the second sub-wiring structures;

(j) forming on the second region a plurality of second external terminals which are electrically connected to the plurality of second wiring structures; and (k) performing singularization by cutting along scribe lines between adjacent circuit element forming regions.

Further, a manufacturing method for a semiconductor device comprises the steps of:

(a) setting a plurality of circuit element forming regions on a semiconductor substrate;

(b) forming a circuit element and a plurality of circuit element connecting pads connected to this circuit element on the circuit element forming region;

(c) setting a first region on which the circuit element and the plurality of circuit element connecting pads are provided, and a second region surrounding the periphery of the first region;

(d) forming a metallic layer in the second region;

(e) forming an insulating film such that the circuit element connecting pads and the metallic layer are partially exposed;

(f) forming on the insulating film a plurality of first wiring structures which are electrically connected to the plurality of circuit element connecting pads;

(g) forming a plurality of second wiring structures which are electrically connected to the plurality of circuit element connecting pads from the first region to the second region;

(h) forming on the insulating film of the second region a plurality of third wiring structures which are electrically connected to the exposed parts of the metallic layer;

(i) forming a sealing portion on the insulating film such that the first wiring structures, second wiring structures, and third wiring structures are partially exposed;

(j) forming on the first region a plurality of first external terminals which are electrically connected to the plurality of first wiring structures;

(k) forming on the second region a plurality of second external terminals which are electrically connected to one or both of the plurality of second wiring structures and the plurality of third wiring structures; and (l) performing singularization by cutting along scribe lines between adjacent circuit element forming regions.

Further, a manufacturing method for a semiconductor device comprises the steps of:

(a) setting a plurality of circuit element forming regions on a semiconductor substrate;

(b) forming a circuit element and a plurality of circuit element connecting pads connected to this circuit element on the circuit element forming region;

(c) setting a first region on which the circuit element and the plurality of circuit element connecting pads are provided, and a second region surrounding the periphery of the first region;

(d) forming an insulating film such that a part of the circuit element connecting pads is exposed;

(e) forming on the insulating film a plurality of first wiring structures which are electrically connected to the plurality of circuit element connecting pads;

(f) forming a plurality of second wiring structures which are electrically connected to the plurality of circuit element connecting pads from the first region to the second region;

(g) forming on the insulating film of the second region a plurality of third wiring structures which are electrically connected to the exposed parts of the metallic layer;

(h) forming a sealing portion on the insulating film such that the first wiring structures, second wiring structures, and third wiring structures are partially exposed;

(i) forming on the first region a plurality of first external terminals which are electrically connected to the plurality of first wiring structures;

(j) forming on the second region a plurality of second external terminals which are electrically connected to one or both of the plurality of second wiring structures and the plurality of third wiring structures; and (k) performing singularization by cutting along scribe lines between adjacent circuit element forming regions.

BRIEF DESCRIPTION OF THE DRAWINGS

The foregoings and other objects, features and advantageous of the present invention will be better understood from the following description taken in connection with the accompanying drawings, in which:

FIGS. 4(A) and (B) are (first) views showing manufacturing processes in a manufacturing method for the semiconductor device of the first embodiment of this invention;

FIGS. 9(A) and (B) are (first) views showing manufacturing processes in a manufacturing method for the semiconductor device of the second embodiment of this invention; and FIG. 10 is a (second) view showing a manufacturing process subsequent to FIG. 9 in the manufacturing method for the semiconductor device of the second embodiment of this invention.

DESCRIPTION OF THE PREFERRED EMBODIMENTS

Figure 1:
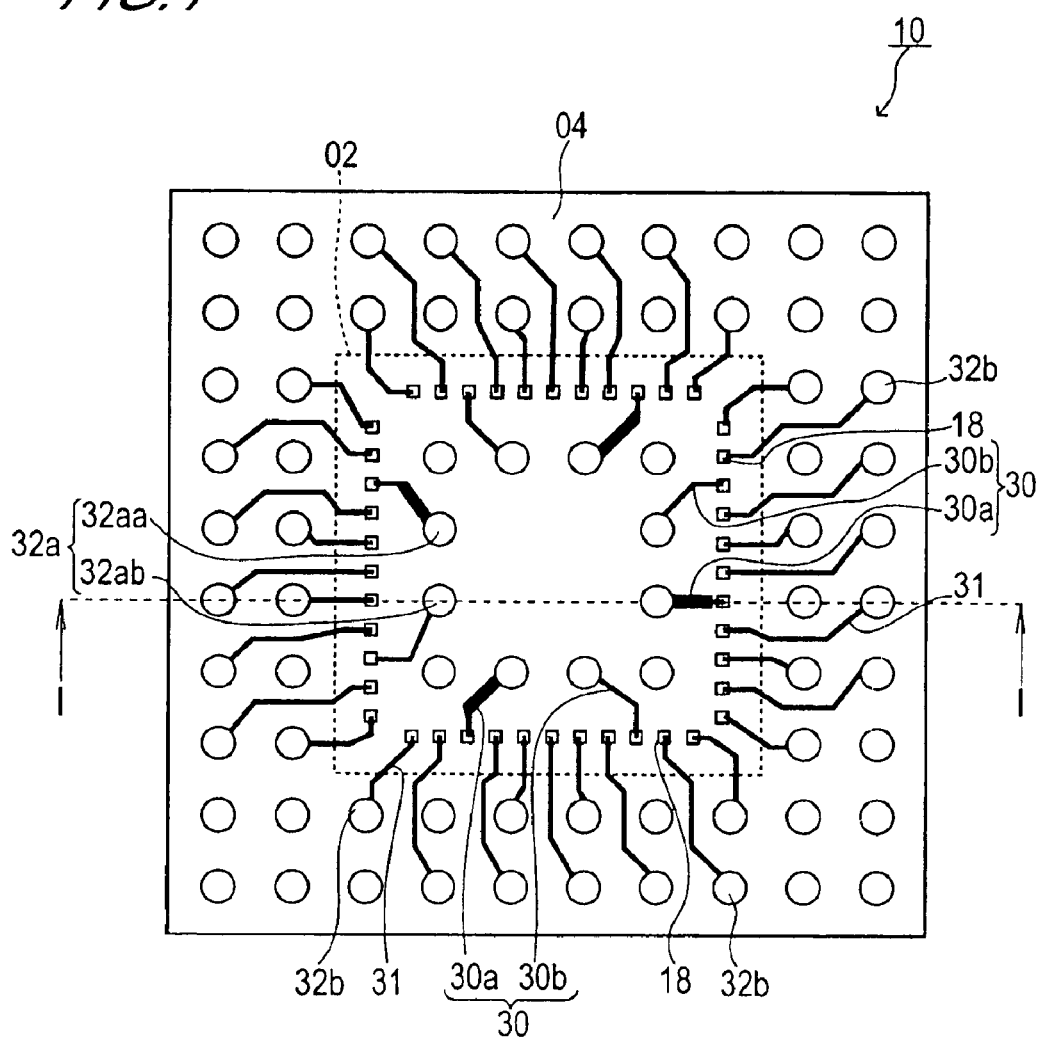
FIG. 1 is a plan view illustrating a constitutional example of a semiconductor device according to a first embodiment.

Embodiments of this invention will be described below with reference to the drawings. Note that in the drawings, the form, magnitude, and positional relationships of each constitutional component are merely illustrated schematically in order to facilitate understanding of this invention and no particular limitations are placed on this invention thereby. Further, although specific materials, conditions, numerical value conditions, and so on are used in the following description, these are merely one preferred example thereof and therefore do not place any limitations on this invention. It is to be understood that similar constitutional components in the drawings used in the following description are allocated and illustrated with identical reference symbols, and that duplicate description thereof has occasionally been omitted.

First Embodiment

1. Constitution of the Semiconductor Device

Figure 2:
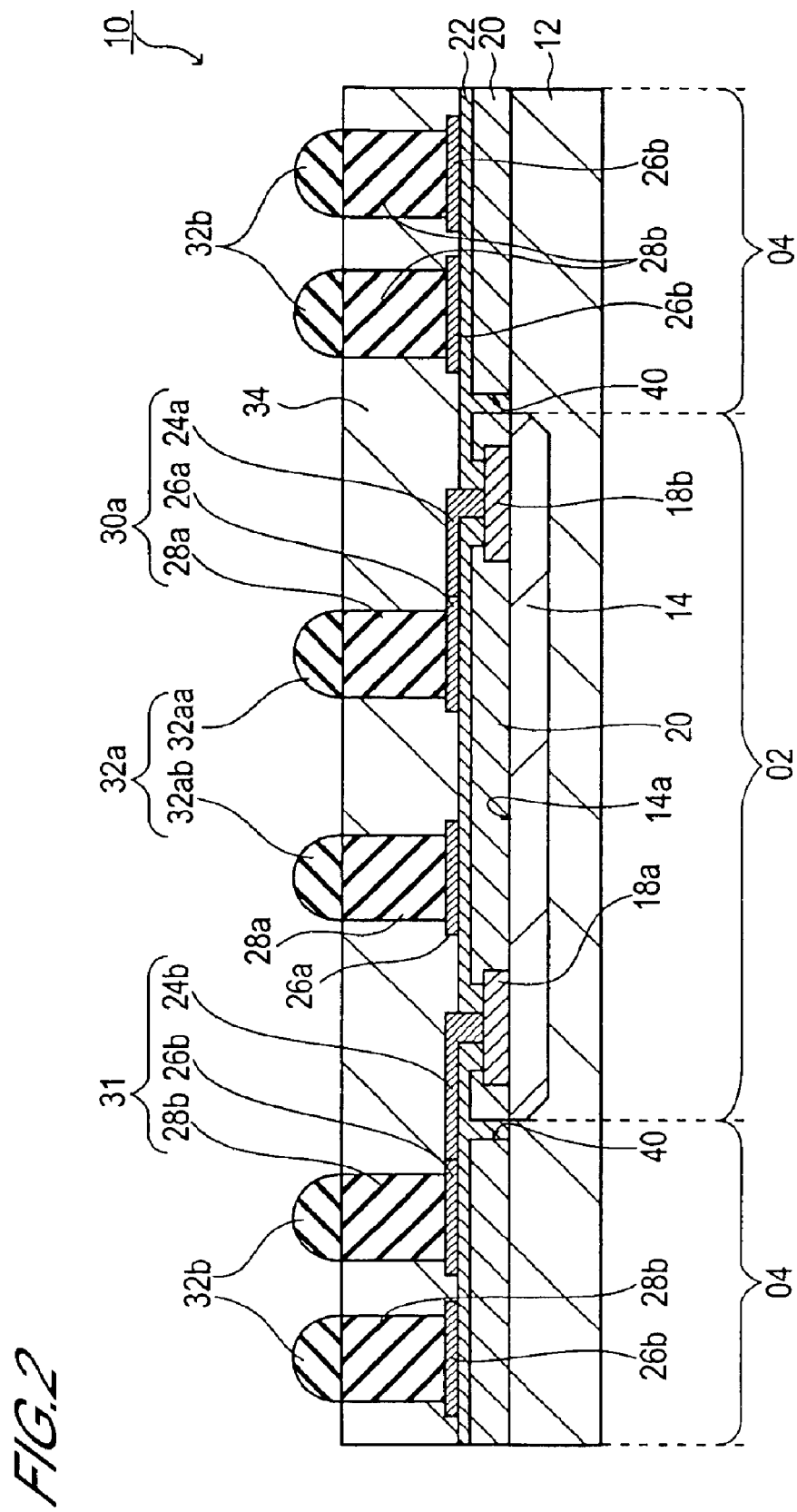
FIG. 2 is a sectional pattern diagram showing a cross section of the semiconductor device of the first embodiment severed along a broken line I—I in FIG. 1.

A constitutional example of a semiconductor device 10 of this embodiment will be described with reference to FIGS. 1 and 2. FIG. 1 is a transparent plan view seen from above the semiconductor device 10 illustrating the disposal relationships of the constitutional elements. To facilitate description of the formed wiring structures, a sealing portion (to be described below) which is actually formed on the upper face thereof has been made transparent. FIG. 2 is a sectional pattern diagram showing a cross section severed along a broken line I—I in FIG. 1.

The semiconductor device 10 comprises a semiconductor substrate (semiconductor wafer) 12 on which a first region 02 serving as a circuit element forming region and a second region 04 surrounding the first region 02 are formed integrally in advance. According to this embodiment, the first region 02, which is surrounded by a broken line in FIG. 1, is a region on which a circuit element 14 shown in FIG. 2 is formed. The circuit element 14 is typically constituted by a plurality of active elements having an integrated circuit such as an LSI.

As shown in FIG. 2, in the semiconductor device 10, a surface 14a of the circuit element 14 formed in the first region 02 of the semiconductor substrate 12 serves as the surface of the semiconductor substrate 12 in the first region 02. The region beyond the first region 02 of the semiconductor substrate 12 serves as the second region 04.

Typically, a multi-layer wiring structure (not shown in the drawing, to be referred to as "internal wiring" below) is formed on the circuit element 14 such that the plurality of active elements cooperate to exhibit a predetermined function. A plurality of electrode pads (to be referred to as "circuit element connecting pads" below) 18 which are connected to the circuit element and wiring structures are provided on the first region 02. According to the constitution shown in FIG. 1, the plurality of circuit element connecting pads 18 is provided along the inner periphery of the first region 02 such that the pitch of adjacent circuit element connecting pads 18 is equal.

A plurality of first external terminals 32a is disposed on the first region 02 of the semiconductor device 10. A plurality of second external terminals 32b is disposed on the second region 04 of the semiconductor device 10.

The plurality of first external terminals 32a is provided on the first region 02 such that the pitch of adjacent first external terminals 32a is equal. Likewise, the plurality of second external terminals 32b is provided on the second region 04 such that the pitch of adjacent second external terminals 32b is equal.

According to this constitutional example of the first embodiment, the external terminals which are to be connected to a power source or grounded are gathered together and formed on the first region 02.

FIG. 1 shows an example in which, of the twelve first external terminals 32a disposed around the inside of the circuit element connecting pads 18, one external terminal to be connected to a power source or grounded is disposed on each side of the rectangle symmetrically about the center of the circuit element forming region, or in other words the first region 02. The external terminals to be connected to a power source or grounded are indicated as first sub-external terminals 32aa, and the other external terminals, which are not to be connected to a power source or grounded, are indicated as second sub-external terminals 32ab.

The plurality of first external terminals 32a is electrically connected to the plurality of circuit element connecting pads 18 by a plurality of first wiring structures 30 in a so-called fan-in configuration.

Here, the wires connected to the first sub-external terminals 32aa are preferably constituted such that the surface area of a cross section severed in an orthogonal direction to the direction in which the wires extend is larger than the surface area of a cross section severed in an orthogonal direction to the direction in which the other wires, for example the wires connected to the second sub-external terminals 32ab, extend. In other words, one or both of the width and the thickness of the wires is increased. The wiring region having the larger cross section is preferably set as a main region excluding the partial region which is connected to the electrode pads.

In FIG. 1, the wires connected to the first sub-external terminals 32aa are indicated as first sub-wiring structures 30a, and the wires connected to the second sub-external terminals 32ab are indicated as second sub-wiring structures 30b.

The first sub-wiring structure 30a is preferably formed from a material having a lower resisitivity and a lower magnetic permeability than the other wiring structures.

More specifically, the first sub-wiring structure 30a is preferably formed from copper (Cu) in consideration of ease of manufacture and properties such as conductivity.

The plurality of second external terminals 32b is electrically connected to the plurality of circuit element connecting pads 18 by a plurality of second wiring structures 31 in a fan-out configuration.

Note that in the semiconductor device of this invention, the number obtained by adding the total number of second wiring structures 31 formed on the second region 04 to the total number of first wiring structures 30 formed on the first region 02 is preferably equal to or less than the total number of circuit element connecting pads 18 provided on the first region 02.

As shown in FIG. 2, the semiconductor device 10 comprises the plurality of circuit element connecting pads 18 on the first region 02. A passivation film 20 is formed on the semiconductor substrate 12 such that a part of the circuit element connecting pads 18 protrudes therefrom.

Groove portions 40 are provided in the semiconductor device 10 around the outer periphery of the first region 02. In the constitutional example shown in FIG. 2, the groove portions 40 provided in the passivation film 20 correspond to second scribe lines L2 to be described below (this will be described in detail below).

An insulating film 22 for stabilizing and facilitating the formation of a first redistribution wiring layer 24a and second redistribution wiring layer 24b is formed on the passivation film 20.

The insulating film 22 is provided such that the circuit element connecting pads 18, or in other words the circuit element connecting pads 18a and 18b shown in FIG. 2, are partially exposed.

Wires are connected to the circuit element connecting pads 18 exposed from the insulating film 22.

Here, referring to FIG. 2, the first wiring structure 30 and second wiring structure 31, which are connected to the circuit element connecting pads 18, will be described respectively.

According to this embodiment, the first wiring structure 30 comprises a first post portion 28a serving as an electrode post which is electrically connected to the first external terminal 32a, and a first redistribution wiring layer 24a for electrically connecting the first post portion 28a to the circuit element connecting pad 18b. Note that a part of the first redistribution wiring layer 24a preferably serves as a first post pad 26a, and the first post portion 28a is preferably electrically connected to the first post pad 26a.

The second wiring structure 31 comprises a second post portion 28b serving as an electrode post which is electrically connected to the second external terminal 32b, and a second redistribution wiring layer 24b for electrically connecting the second post portion 28b to the circuit element connecting pad 18a. Note that a part of the second redistribution wiring layer 24b preferably serves as a second post pad 26b, and the second post portion 28b is preferably electrically connected to the second post pad 26b.

As shown in FIG. 2, the first redistribution wiring layer 24a is formed as a wire in a fan-in configuration connecting the circuit element connecting pad 18b to the first post portion 28a within the first region 02. Also in FIG. 2, the second redistribution wiring layer 24b is formed as a wire in a fan-out configuration connecting the circuit element connecting pad 18a to the second post portion 28b from the first region 02 to the second region 04.

The first post pad 26a and second post pad 26b are provided on the insulating film 22. As shown in FIG. 2, one end side of the first redistribution wiring layer 24a is electrically connected to the top face of the circuit element connecting pad 18b through the insulating film 22. The first rewiring layer 24a is formed so as to extend from this one end side to the top of the insulating film 22, and the other end side of the first redistribution wiring layer 24a serves as the first post pad 26a. Similarly to the first redistribution wiring layer 24a, one end side of the second redistribution wiring layer 24b is electrically connected to the other circuit element connecting pad 18a, and the other end side thereof serves as the second post pad 26b.

Here, the first post pad 26a is preferably disposed on the insulating film 22 corresponding to the disposal position of the first external terminal 32a.

Similarly to the first post pad 26a, the second post pad 26b is preferably disposed on the insulating film 22 corresponding to the disposal position of the second external terminal 32b.

In the constitutional example shown in FIG. 2, the connections between the pads and external terminals are performed as follows.

The first post portions 28a are provided on and electrically connected to the first post pads 26a. The second post portions 28b are similarly provided on the second post pads 26b shown in FIG. 2.

A sealing portion 34 is provided on the wiring structures, or in other words on the insulating film 22 formed with the first and second redistribution wiring layers, so as to bury the first post portions 28a formed on the first region 02 and the second post portions 28b formed on the second region 04. The top faces of the first post portions 28a and second post portions 28b are each exposed from the sealing portion 34.

Next, the first external terminals 32a, which are constituted by solder balls, for example, are provided on the top faces of the first post portions 28a exposed from the sealing portion 34, and the second external terminals 32b, which are constituted by solder balls, are similarly provided on the top faces of the second post portions 28b exposed from the sealing portion 34.

Hence in the constitutional example of this embodiment, the first post pad 26a is provided in a position directly below the first external terminal 32a on the insulating film 22 of the first region 02, and the second post pad 26b is provided in a position directly below the second external terminal 32b on the insulating film 22 of the second region 04.

Note that the semiconductor device of this invention is not limited to a case in which the pitches of the first and second external terminals 32a and 32b are equal.

The pitches of the first and second external terminals 32a and 32b and the arrangement formats of the first and second external terminals 32a and 32b are design items to be determined in accordance with the form of the mounting substrate.

The first region 02 and second region 04 are provided on the semiconductor substrate 12. Hence, even when it is difficult to achieve the target pin count simply by disposing a plurality of the first external terminals 32a on the first region 02, the pin count on the mounting face of the semiconductor device 10 of this embodiment can be increased without narrowing the pitch of adjacent external terminals by disposing a plurality of the second external terminals 32b on the second region 04.

By disposing the plurality of first and second external terminals 32a and 32b on the mounting face of the first region 02 and second region 04, the target pin count can be achieved. As a result, a high pin count can be realized.

According to this constitutional example of the semiconductor device 10 of this embodiment, by setting the surface size of the second region 04, which is provided adjacent to and surrounding the first region 02 serving as the circuit element forming region, to a desired size, the size of the mounting face can be modified without altering the design of the circuit element 14 itself.

Also according to this constitutional example of the semiconductor device 10 of this embodiment, since the mounting face can be set to a desired size, a high pin count can be realized with the respective pitches of the first and second external terminals 32a and 32b set in accordance with the desires of the user who is to use the semiconductor device 10.

According to this constitutional example of the semiconductor device 10 of this embodiment, the plurality of first sub-external terminals 32aa, which are terminals to be grounded and terminals to be connected to a power source, are gathered together on the first region 02. Hence the length of the wires which electrically connect the first sub-external terminals 32aa and the circuit element connecting pads 18 can be shortened. Accordingly, the length of the wires connected to the external terminals to be connected to a power source or grounded can be shortened, as a result of which power source resistance components and inductance components occurring in these wires can be reduced.

By means of such a constitution, power bounce or ground bounce caused by parasitic inductance in the wires can be prevented. As a result, operations of the semiconductor device of this embodiment can be stabilized, and malfunctions can be prevented.

Further, by constituting the wires which are connected to a power source or grounded, in other words the first sub-wiring structures 30a, such that the surface area of a cross section severed in an orthogonal direction to the direction in which the wires extend is larger than the surface area of a cross section severed in an orthogonal direction to the direction in which the other wires extend, or in other words such that the width or the thickness of the wires, or both, is increased, resistance components and parasitic inductance in the wires can be reduced even more effectively, enabling the provision of a semiconductor device with even more stable operations.

1. Manufacturing Method of the Semiconductor Device

Next, a manufacturing method for the semiconductor device 10 of this embodiment described with reference to FIGS. 1 and 2 will be described with reference to FIGS. 3 to 6.

The semiconductor device of this invention is obtained by performing a process of singularization on a constitutional body comprising a plurality of semiconductor devices formed in matrix form on a semiconductor wafer by means of a wafer process.

First, using FIGS. 3(A) and (B), a manufacturing process of the semiconductor 10 of this invention will be described in relation to a singularization process for cutting the wafer 12 into individual units.

Figure 3A:
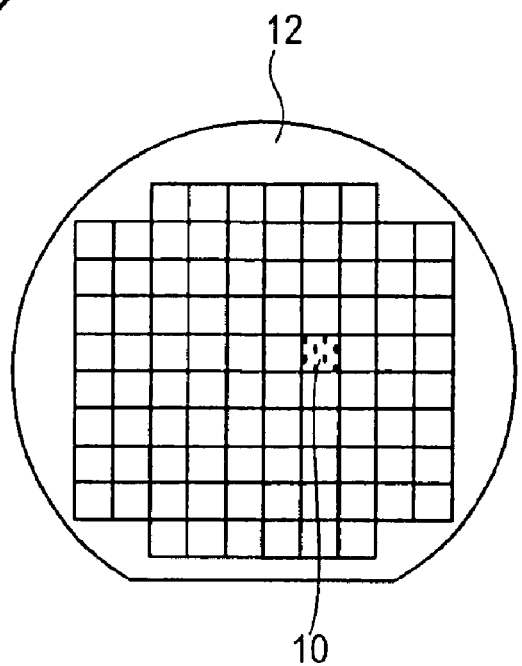
FIG. 3(A) is a view illustrating a constitutional example of a semiconductor wafer during a manufacturing process of this invention.
Figure 3B:
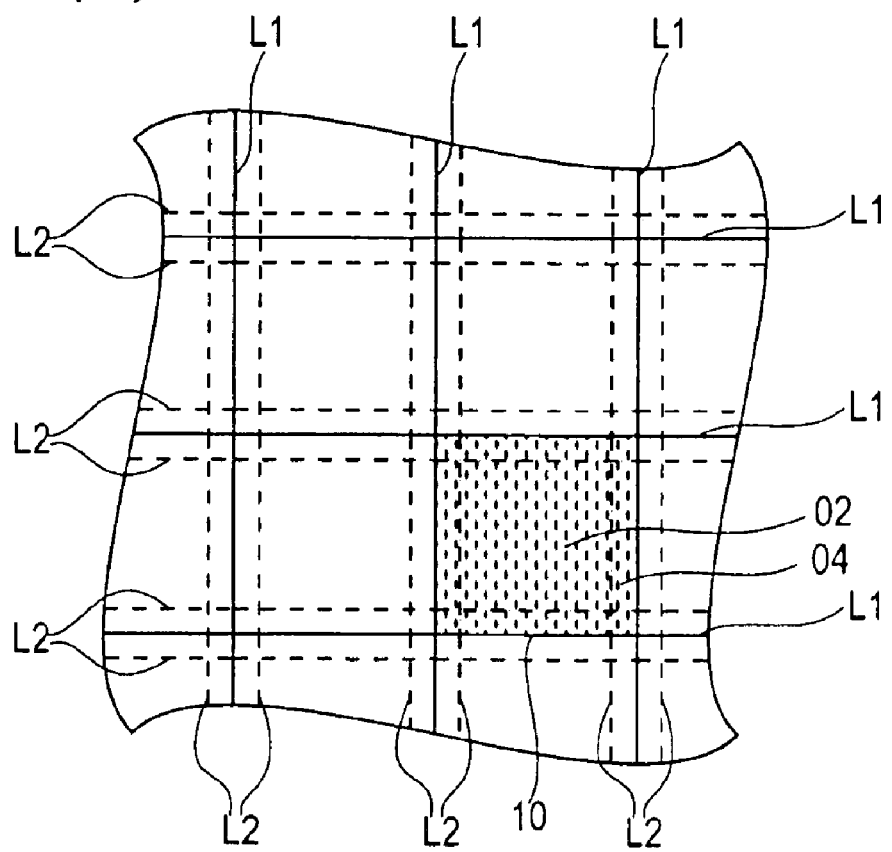
FIG. 3(B) is a partially enlarged view of the semiconductor wafer shown in FIG. 3(A)

FIG. 3 (A) is a schematic plan view seen from above showing the constitution of the semiconductor wafer 12 in a state in which the singularization process described above has not been performed. FIG. 3(B) is a view showing an expanded outline of a partial region of FIG. 3(A) in order to illustrate regional relationships within the semiconductor wafer 12 occupied by a constitutional body to be formed into the semiconductor device 10.

As shown in FIG. 3(A), a plurality of scribe lines are formed in matrix form on the semiconductor wafer 12. One semiconductor device 10 is formed in each of the regions defined by these scribe lines.

The perimeter of the semiconductor device 10 indicated by the reference symbol in FIG. 3(A) is shown in enlarged form in FIG. 3(B). In FIG. 3(B), the plurality of scribe lines are each indicated by the reference symbol L1. If these scribe lines L1 are assumed to be first scribe lines, then each of the regions defined by the plurality of first scribe lines L1 corresponds to a region of the semiconductor device 10, as described above.

As shown in FIG. 3(B), the size of the second region 04 is determined according to a predetermined gap between the first scribe line L1 and a second scribe line L2. This predetermined gap may be set as desired in consideration of the size of the mounting face and the desired pin count.

The second scribe lines, which are allocated the reference symbol L2 and indicated by broken lines, are provided in relation to each of the first scribe lines L1. As shown in FIG. 3(B), two second scribe lines L2 are provided for each first scribe line L1 parallel to the first scribe line L1 with the predetermined gap on each side of the first scribe line L1. Detailed description of the predetermined gap will be provided below.

Prior to singularization and with the plurality of semiconductor devices 10 formed on the semiconductor wafer 12, dicing is performed along the second scribe lines L2 on the outer periphery of the first region 02, or in other words along the groove portions 40 described with reference to FIG. 2, thereby enabling only the first region 02, or in other words only the circuit element forming region, to be cut away from the semiconductor wafer 12 and singularized. In so doing, a chip corresponding to the first region 02 of the semiconductor device 10 cut away from the semiconductor wafer 12 may be applied to a package of a different format to a WCSP.

Here, noting the semiconductor device 10 shown by the dot pattern in FIG. 3(B), the region of the semiconductor device 10 is divided by four of the second scribe lines L2 into the first region 02 and the second region 04, which is the region outside of the first region 02.

According to the constitutional example in FIG. 3(B), the first region 02 is the central region of the semiconductor device 10 defined as a square shape by the four second scribe lines L2, and the second region 04 is the region surrounded by the second scribe lines L2 and first scribe lines L1.

The semiconductor device 10 of this invention is obtained by cutting the semiconductor wafer 12 along the first scribe lines L1 into individual units.

The manufacturing method of the semiconductor device 10 of this embodiment will now be described in detail with reference to FIGS. 4 through 6.

FIGS. 4(A), (B), 5, and 6 are schematic sectional views of a cross section severed similarly to that of FIG. 2 for illustrating a manufacturing process, each representing one constitutional body in the course of manufacture.

As shown in FIG. 4(A), the first region 02 and second region 04 exist on the semiconductor wafer 12, which is a silicon (Si) substrate. A circuit element 14 comprising a plurality of active elements and the like is formed on the first region 02 by normal wafer processing.

The circuit elements 14 are connected to each other by a multi-layer wiring structure (not shown) formed from an alloy containing Al (aluminum), an alloy containing Au (gold), or similar, so as to be capable of exhibiting a predetermined function.

The circuit element connecting pads 18, which are constituted by one type of alloy material selected from an alloy containing Al (aluminum), an alloy containing Au (gold), and an alloy containing Cu (copper), are then formed on the surface 14a of the circuit element 14. Note that the circuit element connecting pads 18 are not limited to a constitution using only the aforementioned alloys as a material, and may be formed using a preferred metallic material.

Next, the passivation film 20, which is constituted using a silicon nitride film (SiN), for example, is formed on the first region 02 and second region 04 of the semiconductor substrate 12 at a film thickness of approximately 0.5 to 1.0 μm.

The passivation film 20 is formed such that a part of the circuit element connecting pads 18 is exposed, and so as to form the groove portions 40 (see FIG. 2). The passivation film 20 is preferably formed with an even upper face.

Next, as shown in FIG. 4 (B), polyimide, for example, which is an insulating material, is coated at an approximate thickness of 10 μm onto the passivation film 20 using a well-known spin coating method to form the insulating film 22. The insulating film 22 is formed such that the groove portions 40 are buried and a part of the circuit element connecting pads 18 is exposed.

More specifically, for example, the insulating film 22 may be formed over the entire surface of the first region 02 and second region 04, whereupon an opening portion 60 reaching the circuit element connecting pads 18 exposed from the passivation film 20 is formed in the main surface of the insulating film 22 using a well-known photolithography technique to expose a part of the circuit element connecting pads 18.

Wiring structures are then formed so as to be connected to the circuit element connecting pads 18 and guided from the opening portions 60 to the insulating film 22.

Figure 5:
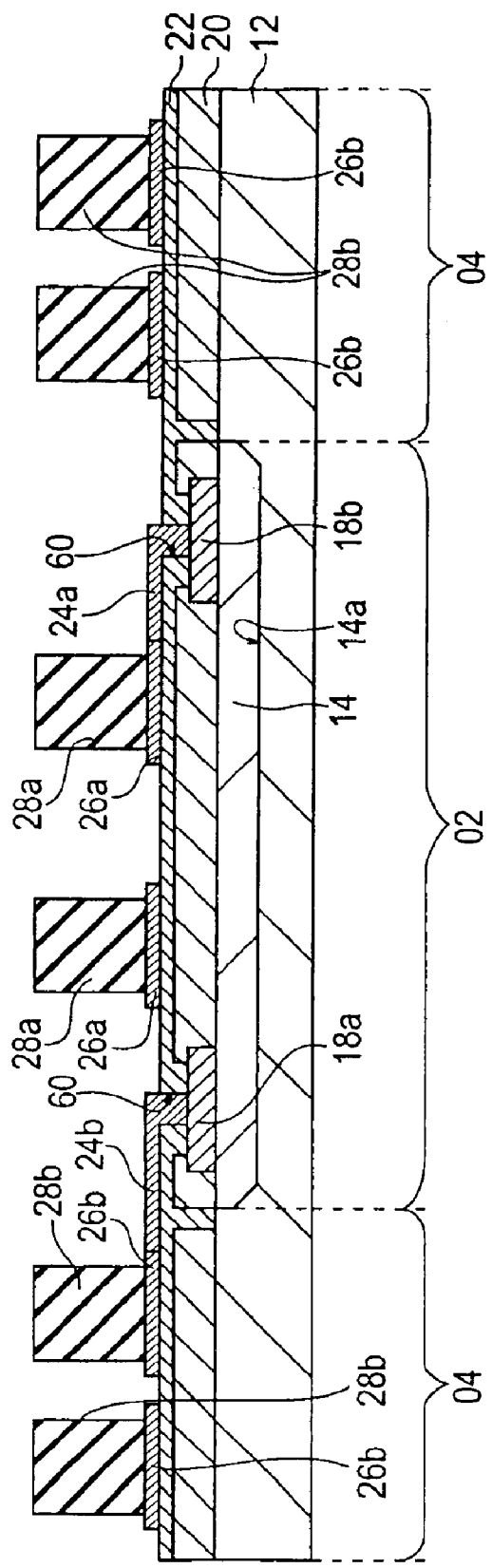
FIG. 5 is a (second) view showing a manufacturing process subsequent to FIG. 4 in the manufacturing method for the semiconductor device of the first embodiment of this invention.

As shown in FIG. 5, the first sub-wiring structure 30a, which is guided from the opening portion 60 toward the center of the circuit element forming region 14, is formed as the first redistribution wiring layer 24a.

The second wiring structure 31 is formed on the surface of the insulating film 22 from the first region 02 to the second region 04 as the second redistribution wiring layer 24b. The first and second redistribution wiring layers 24a and 24b are preferably formed simultaneously according to an identical process using either copper (Cu) or an alloy containing copper (Cu) as a material.

At this time, at least the wires of the first redistribution wiring layers 24a which are connected to terminals to be connected to a power source or terminals to be grounded are preferably formed as shorter wires in order to reduce resistance components and parasitic inductance in the wires.

To reduce resistance components and parasitic inductance in the wires, at least the wires of the first redistribution wiring layers 24a that are connected to terminals to be connected to a power source or terminals to be grounded are preferably formed such that the surface area of a cross section of a partial region severed in an orthogonal direction to the direction in which the wires extend is larger than the surface area of a cross section of the other wires, for example the wires connected to the second sub-external terminals 32ab. In other words, one or both of the width and the thickness of these wires is preferably increased.

Also regarding at least the wires of the first redistribution wiring layers 24a that are connected to terminals to be connected to a power source or terminals to be grounded in this constitutional example of this embodiment, for example, these wires are connected to terminals to be connected to a power source or terminals to be grounded, and hence in order to reduce parasitic inductance in the wiring layers, these wires are preferably formed from a material having low resistivity and low magnetic permeability.

Here, the manufacturing process for the redistribution wiring layers will be described. First, a metallic film is provided on the insulating film 22 so as to bury the two opening portions 60 described with reference to FIG. 4(B).

The metallic film is formed into the desired wiring structures by a well-known photolithography technique. As shown in FIG. 5, the first redistribution wiring layer 24a and second redistribution wiring layer 24b, the first external terminal connecting pad 26a formed as a part of the first redistribution wiring layer 24a, and the second external terminal connecting pad 26b formed as a part of the second redistribution wiring layer 24b are formed thereby.

Here, an example was described in which the first and second redistribution wiring layers 24a and 24b are formed simultaneously by an identical process, but the first redistribution wiring layer 24a and second redistribution wiring layer 24b may be formed by different processes using different materials.

Next, conductive posts are formed on the formed wiring layers. In this process, the first post portion 28a and second post portion 28b are formed by disposing patterned resist as a mask using a well-known photolithography technique, depositing a conductor such as copper (Cu), for example, using a well-known method, and then removing the resist.

Note that in this photolithography process, dry development resist is preferably used to perform dry development.

Here, the first redistribution wiring layer 24a and second redistribution wiring layer 24b are preferably formed at a film thickness of approximately 5 $\mu$m respectively.

Further, the sectional form of the first and second post portions 28a and 28b in an orthogonal direction to the direction of extension (the vertical direction of the paper surface in the drawing) is preferably set as a cylindrical form with a circle diameter of approximately 100 to 250 $\mu$m.

Figure 6:
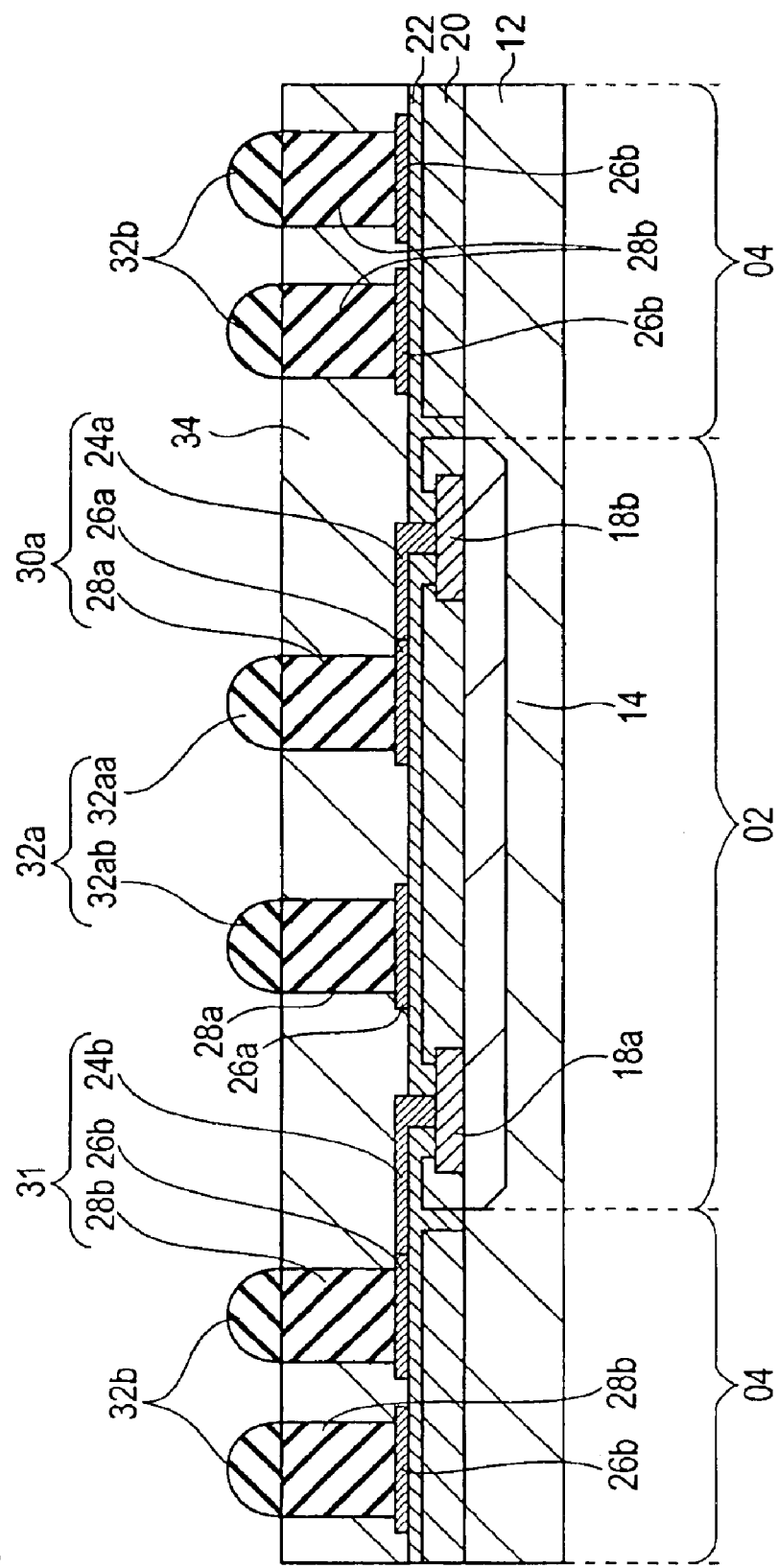
FIG. 6 is a (third) view showing a manufacturing process subsequent to FIG. 5 in the manufacturing method for the semiconductor device of the first embodiment of this invention.

Next, as shown in FIG. 6, the sealing portion 34 is formed by a well-known transfer mold method or printing method using a sealing resin such as an epoxy mold resin or liquid sealing material, for example. At this time, grinding or the like is performed such that the top faces of the first and second post portions 28a and 28b are exposed from the sealing portion 34.

A method such as film formation may also be applied to the formation of the sealing portion 34. In this case, substantially no load is placed on the first and second post portions 28a and 28b. Also in this case, the sealing portion 34 can be formed directly such that the top faces of the post portions 28 are exposed on the surface of the sealing portion 34, without the need to perform the aforementioned grinding process on the sealing portion 34.

Desired processing according to design requirements may also be performed on the exposed top faces of the post portions 28. For example, when the material of the post portions 28 is copper, a thin Ni (nickel) film may be formed on the top faces of the post portions 28 as a barrier metal layer.

Next, the first and second external terminals 32a and 32b are formed by a well-known printing and reflow method or by mounting solder balls or the like and then performing reflowing (FIG. 6). Here, an example is described in which the external terminals are connected using the conductive posts, but the external terminals may be connected directly to a part of the wiring structures exposed from the sealing portion 34 without using posts, for example.

At this point, wafer level semiconductor device packaging in this embodiment is complete.

Next, the semiconductor wafer 12, in a state in which the packaging described above is complete, is cut along the first scribe lines L1 into individual units, as described with reference to FIG. 3(B). In so doing, a plurality of the semiconductor devices 10 of the first embodiment having an identical constitution can be manufactured from a single wafer.

According to the manufacturing method for the semiconductor device 10 of this embodiment as described above, a semiconductor device is manufactured by a well-known WCSP process. Hence there is no need to introduce a new production line, and thus the semiconductor device can be manufactured at an equal cost to that of a conventional semiconductor device.

Second Embodiment

Next, referring to FIGS. 7 through 9, a second embodiment of the semiconductor device of this invention will be described.

Note that similar constitutional components to the first embodiment have been allocated identical numbers, and detailed description thereof has been omitted.

1. Constitutional Example of the Semiconductor Device

Similarly to the first embodiment, the semiconductor device of this embodiment is obtained by cutting a constitutional body comprising a plurality of semiconductor devices formed on a semiconductor wafer into individual units.

First, the constitution of the semiconductor device of this embodiment will be described with reference to FIGS. 7 and 8. FIG. 7 is a transparent plan view for illustrating the constitutional elements of the semiconductor device of the second embodiment. To facilitate description of the formed wiring structures, a sealing portion which is actually formed on the upper surface thereof has been made transparent. FIG. 8(A) is a sectional pattern diagram showing a cross section of the semiconductor device of FIG. 7 severed along a broken line I—I. FIG. 8 (B) is a sectional pattern diagram showing a cross section of the semiconductor device of FIG. 7 severed along a broken line II—II.

A semiconductor device 10 of this embodiment, similarly to the semiconductor device described with reference to FIGS. 1 and 2, comprises a first region 02, which is the region in which a circuit element 14 is formed, in the center and a second region 04 surrounding the first region 02. Also similarly to the first embodiment, a plurality of circuit element connecting pads 18 is provided in the first region 02.

Figure 7:
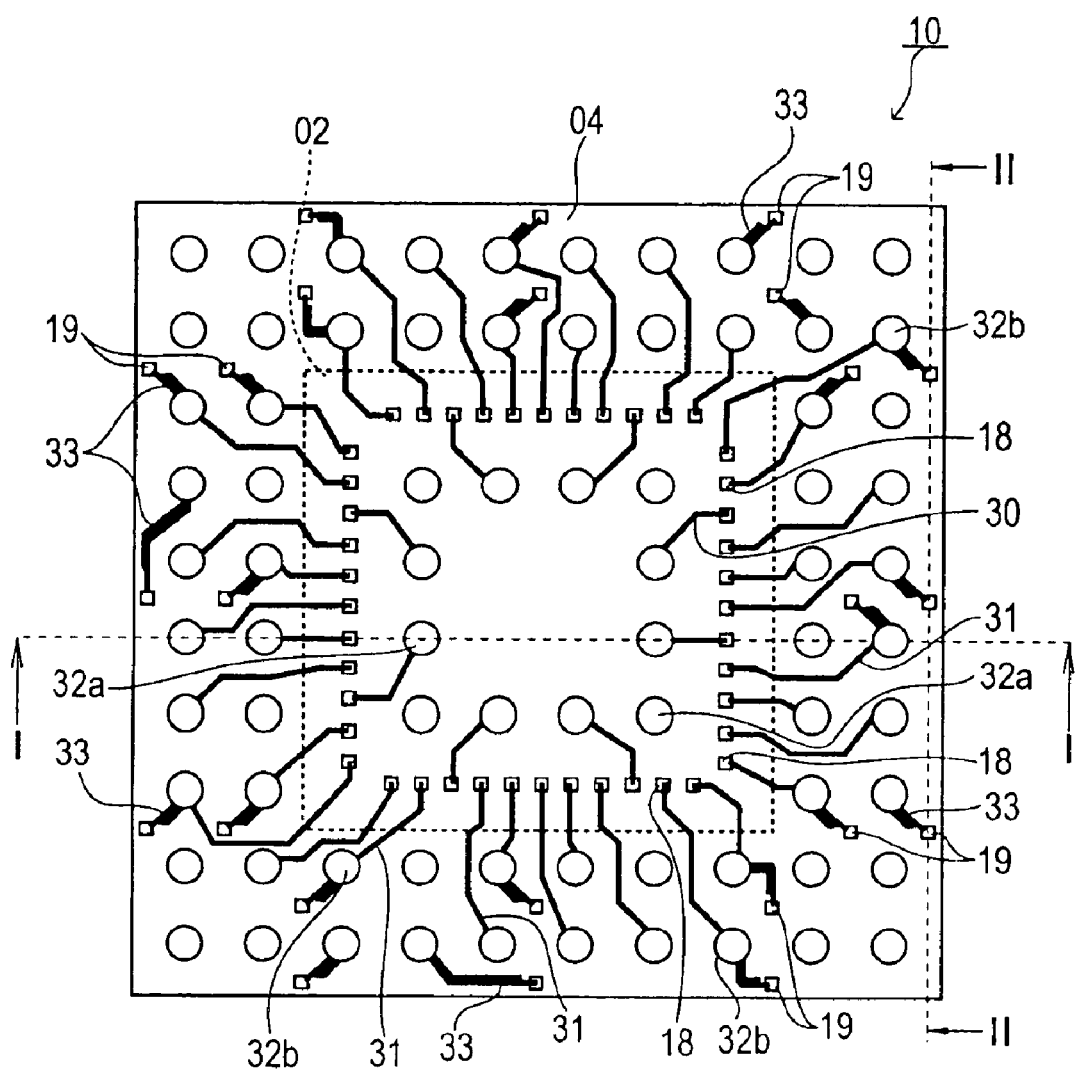
FIG. 7 is a plan view illustrating a constitutional example of a semiconductor device according to a second embodiment.
Figures 8A, 8B:
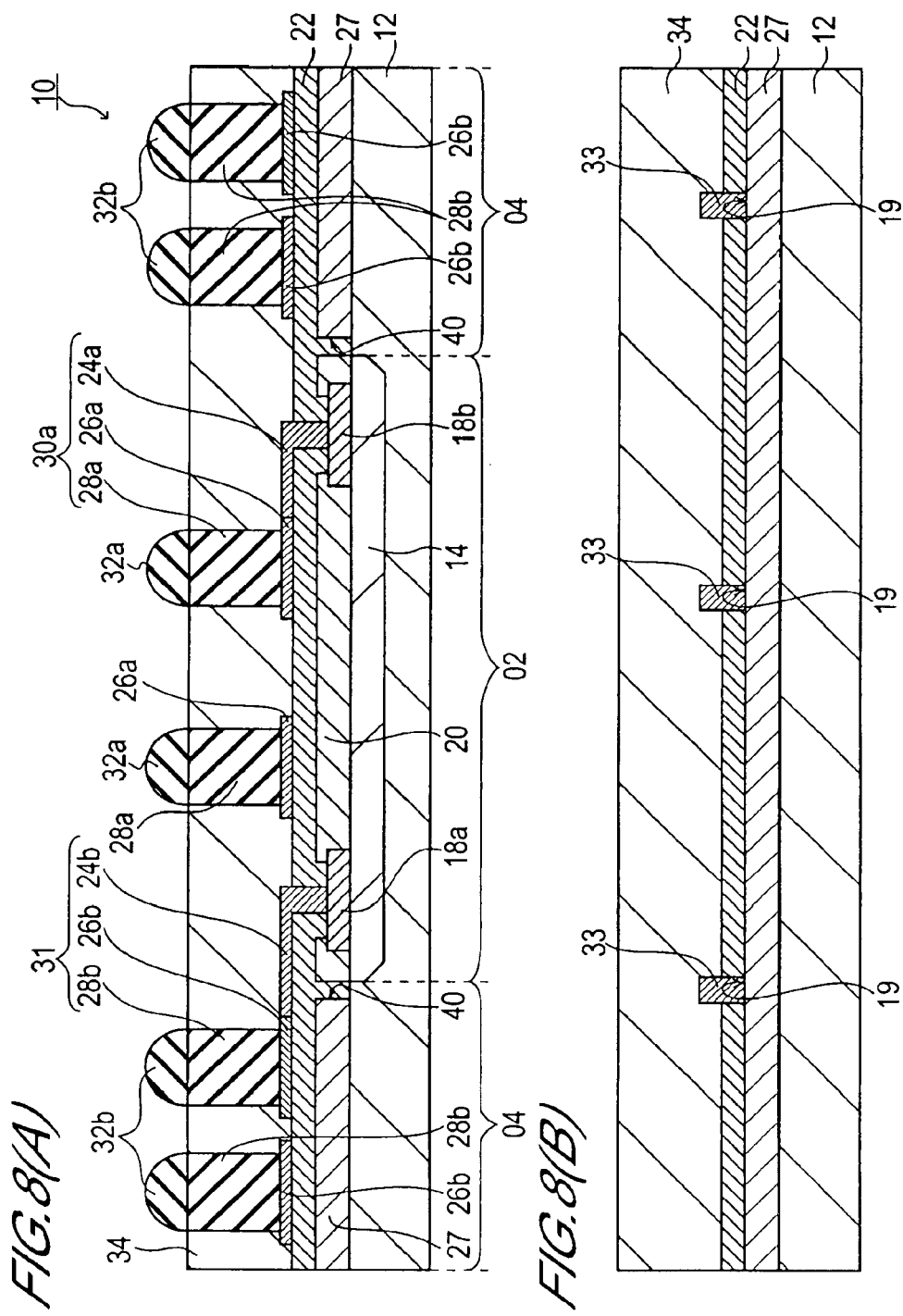
FIG. 8(A) is a sectional pattern diagram showing a cross section of the semiconductor device of the second embodiment severed along a broken line I—I in FIG. 7.
FIG. 8(B) is a sectional pattern diagram showing a cross section of the semiconductor device of FIG. 7 severed along a broken line II—II.

The first region 02, which is defined by a broken line in FIG. 7, is the region in which the circuit element 14 shown in FIG. 8(A) is formed.

Similarly to the first embodiment, the circuit elements 14 are connected to each other by multi-layer internal wiring (layer) (not shown), for example, so as to be able to exhibit a predetermined function. The plurality of circuit element connecting pads 18, connected to the circuit element and internal wiring, is provided on the first region 02.

A plurality of first external terminals 32a is disposed on the first region 02 of the semiconductor device 10. A plurality of second external terminals 32b is disposed on the second region 04 of the semiconductor device 10.

The plurality of first external terminals 32a is provided on the first region 02 such that the pitch of adjacent first external terminals 32a is equal. The plurality of second external terminals 32b is provided on the second region 04 such that the pitch of adjacent second external terminals 32b is equal.

In the constitutional example of this embodiment, the plurality of first external terminals 32a is electrically connected to the plurality of circuit element connecting pads 18 by a plurality of first wiring structures 30* in a so-called fan-in configuration, similarly to the first embodiment. The first external terminals 32a are preferably connected to a power source in order to prevent power bounce during an operation.

At this time, of the first wiring structures 30 connected to the first external terminals 32a and circuit element connecting pads 18, at least the wires which are connected to the first external terminals 32a to be connected to a power source are preferably constituted such that the surface area of a cross section of a partial region severed in an orthogonal direction to the direction in which the wires extend is larger than the surface area of a cross section of the wires which are connected to other wires. In other words, these wires are preferably formed with one or both of a greater width and a greater thickness.

The first wiring structures 30 to be connected to a power source are preferably formed from a material having low resistivity and low magnetic permeability.

The plurality of second external terminals 32b is electrically connected to the plurality of circuit element connecting pads 18 by a plurality of second wiring structures 31 in a fan-out configuration.

As shown in FIG. 8, a metallic layer 27 is provided on the second region 04 of the semiconductor substrate 12 of this embodiment. The material and soon of the metallic layer 27 will be described in the description of the manufacturing process thereof.

A passivation film 20 is provided on the first region 02 such that a part of the circuit element connecting pads 18a and 18b is exposed. Here, the passivation film 20 may also be provided on the metallic layer 27 according to a manufacturing process selection to be described below.

As shown in FIG. 8(A), groove portions 40 are provided in the passivation film 20 along the outer periphery of the first region 02. The groove portions 40 correspond to the scribe lines L2 described with reference to FIG. 3 of the first embodiment.

An insulating film 22 for stabilizing and facilitating formation of a first redistribution wiring layer 24a and second redistribution wiring layer 24b is formed on the passivation film 20.

The insulating film 22 is provided such that the circuit element connecting pads 18, or in other words the circuit element connecting pads 18a and 18b shown in FIG. 8 (A), are partially exposed.

Further, as shown in FIG. 8(B), the insulating film 22 is provided such that the metallic layer 27 is partially exposed. At this time, if the passivation film 20 is provided on the metallic layer 27, the insulating film 22 is provided such that the metallic layer 27 is partially exposed through the passivation film 20. The parts of the metallic layer 27 exposed from the insulating film 22 will also be referred to as metallic layer connecting pads 19 below.

As shown in FIGS. 7 and 8(B), the metallic layer connecting pads 19 are preferably formed so as to be disposed symmetrically about the center of the semiconductor device, or in other words the center of the first region 02.

In this example, the metallic layer connecting pads 19 are provided around the border of the edge of the first region 02 in three groups for each side of the border. Each group comprises two metallic layer connecting pads 19, one group being disposed on each end of each side, and another in the center of each side. Further, the two metallic layer connecting pads 19 forming one group are disposed in series in a perpendicular direction from each side toward the edge of the second region 04.

The disposal position and number of the metallic layer connecting pads 19 are not limited to the illustrated example, and may be modified appropriately according to the specifications and so on of the semiconductor device.

A third wiring structure is connected to the circuit element connecting pads 18 and metallic layer connecting pads 19 exposed from the insulating film 22.

The first wiring structure 30, second wiring structure 31, and third wiring structure 33, which are connected to the circuit element connecting pads 18 and metallic layer connecting pads 19, will now be described. Similarly to the first embodiment, the first wiring structure 30 comprises a first post portion 28a serving as an electrode post which is electrically connected to the first external terminal 32a, and a first redistribution wiring layer 24a for electrically connecting the first post portion 28a to the circuit element connecting pad 18b.

Note that a part of the first redistribution wiring layer 24a preferably serves as a first post pad 26a, and the first post portion 28a is preferably electrically connected to the first post pad 26a.

The second wiring structure 31 comprises a second post portion 28b serving as an electrode post which is electrically connected to the second external terminal 32b, and a second redistribution wiring layer 24b for electrically connecting the second post portion 28b to the circuit element connecting pad 18a. Note that a part of the second redistribution wiring layer 24b preferably serves as a second post pad 26b, and the second post portion 28b is preferably electrically connected to the second post pad 26b.

As shown in FIG. 8(A), the first redistribution wiring layer 24a is formed as a wire in a fan-in configuration connecting the circuit element connecting pad 18b to the first post portion 28a within the first region 02. Also in FIG. 8(A), the second redistribution wiring layer 24b is provided as a wires in a fan-out configuration connecting the circuit element connecting pad 18a to the second post portion 28b from the first region 02 to the second region 04.

The first post pad 26a and second post pad 26b are provided on the insulating film 22. As shown in FIG. 8 (A), one end side of the first redistribution wiring layer 24a is electrically connected to the top face of the circuit element connecting pad 18b through the insulating film 22. The first redistribution wiring layer 24a is formed so as to extend from this one end side to the top of the insulating film 22, and the other end side of the first redistribution wiring layer 24a serves as the first post pad 26a. Similarly to the first redistribution wiring layer 24a, one end side of the second rewiring layer 24b is electrically connected to the other circuit element connecting pad 18a, and the other end side thereof serves as the second post pad 26b.

Here, the first post pad 26a is preferably disposed on the insulating film 22 corresponding to the disposal position of the first external terminal 32a.

Similarly to the first post pad 26a, the second post pad 26b is preferably disposed on the insulating film 22 corresponding to the disposal position of the second external terminal 32b.

As shown in FIGS. 7 and 8(B), the third wiring structure 33, one end of which is connected to the metallic layer connecting pad 19, is provided in the semiconductor device 10* of this embodiment. The other end of the third wiring structure 33 is connected to a grounded external terminal. As a result, the metallic layer 27 can be used as a ground (GND) potential.

As shown in FIG. 7, the third wiring structure 33 is provided in two configurations. In the first, one end of the third wiring structure 33 is connected to the metallic layer connecting pad 19, and the other end is connected to the second post pad 26b which is connected to the grounded second external terminal 32b from among the second external terminals 32b, or in other words to the second wiring structure 31.

In the second configuration, one end of the third wiring structure 33 is connected to the metallic layer connecting pad 19, and the other end is connected to a second post connecting pad 26b which is not connected to the second wiring structure 31.

In order to reduce resistance components and parasitic inductance in the wires, the third wiring structure 33 is preferably formed using shorter wire.

In order to reduce resistance components and parasitic inductance in the wire, the third wiring structure 33 is preferably formed such that the surface area of a cross section of a partial region thereof which is severed in an orthogonal direction to the direction in which the wire extends is increased, or in other words such that the width or thickness, or both in combination, of the wire is increased.

In the constitutional example shown in FIGS. 7 and 8, the connections between the pads and external terminals are as follows.

The first post portions 28a are provided on and electrically connected to the first post pads 26a. The second post portions 28b are similarly provided on the second post pads 26b shown in FIG. 8(A).

A sealing portion 34 is provided on the insulating film 22 so as to bury the first post portions 28a formed on the first region 02 and the second post portions 28b formed on the second region 04. The sealing portion 34 is formed such that the top faces of the first post portions 28a and second post portions 28b are each exposed from the sealing portion 34.

Next, the first external terminals 32a, which are constituted by solder balls or the like, are provided on the top faces of the first post portions 28a exposed from the sealing portion 34, and the second external terminals 32b are provided on the top faces of the second post portions 28b exposed from the sealing portion 34.

Hence the first post pads 26a are provided in a position directly below the first external terminals 32a on the insulating film 22 of the first region 02, and the second post pads 26b are provided in a position directly below the second external terminals 32b on the insulating film 22 of the second region 04.

According to this constitutional example of the semiconductor device of this embodiment, the first region 02 and second region 04 are provided on the semiconductor substrate 12. Hence, even when it is difficult to achieve the target pin count simply by disposing a plurality of the first external terminals 32a on the first region 02, the pin count on the mounting face of the semiconductor device 10 of this embodiment can be increased without narrowing the pitch of adjacent external terminals by disposing a plurality of the second external terminals 32b on the second region 04.

By disposing the plurality of first and second external terminals 32a and 32b on the mounting face of the first region 02 and second region 04, the target pin count can be achieved. As a result, a high pin count can be realized.

By setting the surface size of the second region 04, which is provided in addition to the first region 02 serving as the circuit element forming region, to a desired size, the size of the mounting face can be modified without altering the design of the circuit element 14 itself.

Since the mounting face can be set to a desired size, a high pin count can be realized with the respective pitches of the first and second external terminals 32a and 32b set in accordance with the desires of the user who is to use the semiconductor device 10.

According to the constitution of the semiconductor device of this embodiment, the metallic layer 27 is formed on the second region 04 of the semiconductor substrate 12. The metallic layer 27 is set as a ground (GND) potential by grounding the third wiring structure 33 which is connected thereto and the second external terminal 32b which is connected to the third wiring structure 33. Accordingly, the wiring structures formed on the second region 04 may be constructed in a so-called micro-strip line configuration.

According to such a constitution, the physical form of the wires formed on the metallic layer 27 serving as a ground potential and the second region 04 enables adjustment of the characteristic inductance. Hence, the wiring structures formed particularly on the second region 04 of the semiconductor device 10 of this embodiment may be used as wiring structures that are capable of high-speed signal transmission.

1. Manufacturing Method of the Semiconductor Device

Next, a manufacturing method for the semiconductor device 10 of this embodiment, described with reference to FIGS. 7 and 8, will be described with reference to FIGS. 9 and 10.

The singularization process and the constitution of the semiconductor device used in the singularization process are as described in the first embodiment with reference to FIGS. 3(A) and 3(B), and hence detailed description thereof has been omitted.

The preferred conditions for the material, form, and so on of the constitutional elements in the manufacturing method are also similar to those of the first embodiment, and hence detailed description thereof has been omitted and points of difference have been emphasized.

FIGS. 9(A), 9(B), and 10 are schematic sectional views of a cross section severed similarly to that of FIG. 8(A) for illustrating a manufacturing process, each representing one semiconductor device in the course of manufacture.

As shown in FIG. 9(A), the first region 02 and second region 04 are formed on the semiconductor wafer 12, which is a silicon (Si) substrate. The circuit element 14, comprising a plurality of active elements and the like, for example, is formed on the first region 02 by normal wafer processing.

The plurality of active elements in the circuit element 14 are connected to each other by multi-layer internal wiring (not shown) formed from an alloy containing Al (aluminum), an alloy containing Au (gold), or similar, so as to be capable of exhibiting a predetermined function.

The circuit element connecting pads 18, which are connected to the circuit element 14, are then formed on the first region 02.

The passivation film 20, which is constituted using a silicon nitride film (SiN), for example, is then formed on the first region 02.

Next, the metallic layer 27 is formed on the second region 04 of the semiconductor substrate 12 from a metallic material by a wafer process employing a well-known photo-resist process or the like. The metallic layer 27 may be formed using the same metallic material as the internal wiring of the circuit element 14 or the circuit element connecting pads 18 as described above, such as an alloy containing Al (aluminum), an alloy containing Au (gold), or an alloy containing Cu (copper).

However, different materials may be used for the internal wiring of the circuit element 14 or the circuit element connecting pads 18 and the wiring materials of the first, second, and third wiring structures to be described below.

For example, if the same material as the internal wiring of the circuit element 14 or the circuit element connecting pads 18 is used, then the metallic layer 27 may be formed prior to the formation process of the passivation film 20, at the same time as and by an identical process to the formation process of the uppermost layer of the internal wiring (also referred to as the internal wiring layer) from among the multiple layers of the internal wiring or the formation process of the circuit element connecting pads 18.

If the metallic layer 27 is formed by an identical process to the formation process of the internal wiring or the formation process of the circuit element connecting pads 18 in this manner, then the passivation film 20 is preferably provided on the first region 02 and second region 04.

The passivation film 20 is formed such that a part of the circuit element connecting pads 18 is exposed, and so as to form the groove portions 40 (see FIG. 8(A)). Here, if the passivation film 20 is also formed on the metallic layer 27, then openings are preferably formed in the passivation film 20 such that a part of the metallic layer 27 is exposed.

Further, the passivation film 20 is preferably formed evenly such that the level of the first region 02 and second region 04 (in other words the height of the upper face of the regions) is equal.

Next, as shown in FIG. 9 (A), polyimide, for example, which is an insulating material, is coated at an approximate thickness of 10 μm onto the passivation film 20 and metallic layer 27 using a well-known spin coating method to form the insulating film 22. The insulating film 22 is formed such that the groove portions 40 are buried and a part of the circuit element connecting pads 18 is exposed. Further, as shown in FIGS. 7 and 9(B), the insulating film 22 is provided such that the metallic layer 27 formed on the second region 04 is partially exposed. The exposed parts of the metallic layer 27 serve as the metallic layer connecting pads 19.

The process for forming the circuit element connecting pads 18 and metallic layer connecting pads 19 may be performed after the passivation film 20 and insulating film 22 are formed over the entire surface of the first region 02 and second region 04, for example. More specifically, the circuit element connecting pads 18 and parts of the metallic layer 27 may be exposed from the passivation film 20 and insulating film 22 by a well-known photolithography technique.

Next, the wiring structures which are guided from the circuit element connecting pads 18 and metallic layer connecting pads 19 are formed.

As shown in FIG. 9(B), the first wiring structure 30, which is guided from the opening portion 60 toward the center of the circuit element forming region 14, is formed as the first redistribution wiring layer 24a.

The second wiring structure 31 is formed from the circuit element connecting pads 18, or in other words from the first region 02 to the second region 04, as the second redistribution wiring layer 24b.

In addition in this embodiment, the third wiring structure 33 is formed from the metallic layer connecting pads 19. The third wiring structure 33 is connected to a grounded external terminal, and is therefore preferably formed from shorter wire in order to reduce resistance components and parasitic inductance in the wire.

Further, in order to reduce resistance components and parasitic inductance in the wire, the third wiring structure 33 is preferably formed such that the surface area of a cross section which is severed in an orthogonal direction to the direction in which the wire extends is increased, or in other words such that the width or thickness, or both in combination, of the wire is increased.

The first redistribution wiring layer 24a, second redistribution wiring layer 24b, and third wiring structure 33 are preferably formed simultaneously, by an identical process, and from the same material in order to simplify the process.

If desired, however, the first redistribution wiring layer 24a, second redistribution wiring layer 24b, and third wiring structure 33 may be formed at different times, by different processes, and from different wiring materials.

In particular, the second redistribution wiring layer 24b and third wiring structure 33 are formed in the aforementioned micro-strip line configuration, and hence, in order to obtain a desired characteristic inductance, the second redistribution wiring layer 24b and third wiring structure 33 are formed at an optimum wire width and thickness in consideration of the material and thickness of the metallic layer 27, the material and thickness of the insulating film 22, and so on.

Similarly to the first embodiment, in order to reduce resistance components and parasitic inductance in the wires, at least the wires of the first redistribution wiring layers 24a that are connected to external terminals to be connected to a power source are preferably formed such that the surface area of a cross section severed in an orthogonal direction to the direction in which the wires extend is larger than the surface area of a cross section of the other wires, or in other words such that either the width or the thickness of these wires, or both in combination, is increased.

Also regarding at least the wires of the first redistribution wiring layers 24a that are connected to external terminals to be connected to a power source, in order to reduce resistance components and parasitic inductance in the wires, these wires are preferably formed by selecting a material having low resistivity and low magnetic permeability.

The first redistribution wiring layer 24a, second redistribution wiring layer 24b, and third wiring structure 33 are formed as follows. In other words, a metallic film connected to the electrode pads 18 and 19 is formed on the insulating film 22.

The metallic film is formed into the wiring structures by a process employing a well-known photolithography technique. More specifically, as shown in FIG. 9(B), the first redistribution wiring layer 24a and second redistribution wiring layer 24b, the first external terminal connecting pad 26a formed as a part of the first redistribution wiring layer 24a, and the second external terminal connecting pad 26b formed as a part of the second redistribution wiring layer 24b are formed thereby.

Further, as shown in FIG. 7, the third wiring structure 33 is formed from the metallic layer connecting pads 19.

Next, the first post portion 28a and second post portion 28b are formed on the formed wiring structures of the first region 02 and second region 04 respectively by disposing patterned resist as a mask using a well-known photolithography technique, depositing a conductor such as copper (Cu), for example, using a well-known method, and then removing the resist.

Next, as shown in FIG. 10, the sealing portion 34 is formed by a well-known transfer mold method or printing method using a sealing resin such as an epoxy mold resin or liquid sealing material, for example.

In the semiconductor device of this embodiment, the wiring structures formed in the second region, i.e. the second redistribution wiring layer 24*b* and third wiring structure 33, are formed in a so-called micro-strip line configuration. In addition to the aforementioned optimization of the wiring structures, by optimizing the material and thickness of the metallic layer 27, the material and thickness of the insulating layer, and so on in accordance with the constitution of the second redistribution wiring layer 24*b* and third wiring structure 33, wiring having a desired characteristic can be formed.

Next, grinding or the like is performed such that the top faces of the first and second post portions 28*a* and 28*b* are exposed from the sealing portion 34.

Next, the first and second external terminals 32*a* and 32*b* are formed by a well-known printing and reflow method or by mounting solder balls or the like and then performing reflowing. Here, an example is described in which the external terminals are connected using metallic posts, but the external terminals may be connected directly using a part of the wiring structures exposed from the sealing portion 34 as electrode pads and without using conductive posts, for example.

At this point, wafer level semiconductor device packaging in this embodiment is complete.

Next, the semiconductor wafer 12, in a state in which the packaging described above is complete, is cut along the first scribe lines L1 into individual units, as described with reference to FIG. 3(B). In so doing, a plurality of the semiconductor devices 10 having an identical constitution can be manufactured from a single wafer.

According to the manufacturing method for the semiconductor device 10 of this embodiment as described above, the semiconductor device 10 is manufactured by a well-known WCSP manufacturing process. Hence there is no need to introduce a new production line, and thus the semiconductor device of this embodiment can be manufactured at an equal cost to that of a conventional semiconductor device.

According to the manufacturing method for the semiconductor device of this invention, formation of the post portions, redistribution wiring layers, and pads on the wiring structures may be performed simultaneously or separately. The first and second external terminals may also be formed simultaneously or separately.

According to the semiconductor device of this invention, a plurality of the first external terminals is disposed on a mounting face having an equal size to the first region, and a plurality of the second external terminals is disposed on a mounting face having an equal size to the second region. Hence the size of the first region and second region, or in other words the surface size of the semiconductor substrate, is equal to the size of the mounting face of the semiconductor device of this invention.

In the semiconductor device of this invention, the second region is provided adjacent to the first region such that the mounting face is of a sufficient size for the target pin count to be achieved.

The plurality of first external terminals is electrically connected to the circuit element connecting pads by the plurality of first wiring structures formed in a fan-in configuration, and the plurality of second external terminals is electrically connected to the circuit element connecting pads by the plurality of second wiring structures formed in a fan-out configuration.

Hence, according to the semiconductor device of this invention, when the pin count is to be increased, a plurality of the second external terminals may be disposed on the second region when it is difficult to achieve the target pin count by simply disposing a plurality of the first external terminals on a mounting face of an equal size to the first region.

Also according to the semiconductor device of this invention, the second region is provided in relation to the first region, which serves as a circuit element forming region, and thus the size of the mounting face can be set to a desired size without altering the design of the circuit element itself. Further, by providing a plurality of the first and second external terminals on a mounting face of this size in the manner described above, the target pin count can be achieved on the mounting face, and as a result a high pin count can be realized.

Also according to the semiconductor device of this invention, the size of the mounting face can be set to a desired size, and hence a high pin count can be realized with the respective pitches of the first and second external terminals set in accordance with the desires of the user who is to use the semiconductor device.

Further, according to the constitution of the semiconductor substrate of this invention, if scribe lines are provided on the semiconductor substrate in relation to the respective outer peripheries of the first region and second region while the semiconductor substrate is formed on a semiconductor wafer and prior to packaging, then the first region alone, or in other words the circuit element forming region alone, may be cut away from the semiconductor wafer by performing dicing along the scribe lines provided on the outer periphery of the first region. In this case, packaging other than the WCSP constitution package described above may be performed on a semiconductor chip comprising the first region cut away from the semiconductor substrate.

According to the constitutional example of the semiconductor device of the first embodiment, at least the wires which are connected to a power source or to terminals that are to be connected to a power source or grounded are constituted so as to be connected to the first external terminals on the first region.

Accordingly, the length of the wires from the electrode pad to the external terminal can be reduced to the greatest extent possible, enabling a reduction in parasitic inductance in the wires and prevention of power or ground bounce caused by malfunctions of the semiconductor device.

In the constitutional example of the semiconductor device of the second embodiment, the metallic layer and the third wiring structure connected thereto are provided on the second region and connected to the external terminals. Since the external terminals are thus made into ground (GND) terminals, the metallic layer can be maintained as a ground potential.

Accordingly, the second region takes a so-called microstrip line configuration, and hence the wires formed on the second region can be made capable of high-speed signal transmission.

What is claimed is:

1. A semiconductor device comprising:
   a semiconductor substrate having a first region formed with a circuit element and provided with a plurality of circuit element connecting pads to which said circuit element is connected, and a second region surrounding the periphery of said first region;
   a first, external terminal having a plurality of first sub-external terminals disposed on said first region and composed of terminals to be grounded and terminals to be connected to a power source, and a plurality of second sub-external terminals disposed on said first region;
   a plurality of second external terminals disposed on said second region;
   a first wiring structure having a first sub-wiring structure provided on said first region for electrically connecting said plurality of first sub-external terminals and said plurality of circuit element connecting pads, and a second sub-wiring structure provided on said first region for electrically connecting said plurality of second sub-external terminals and said plurality of circuit element connecting pads; and
   a plurality of second wiring structures provided from said first region to said second region for electrically connecting said plurality of second external terminals and said plurality of circuit element connecting pads.

2. The semiconductor device according to claim 1, wherein the surface area of a cross section of said first sub-wiring structure severed in an orthogonal direction to the direction of extension thereof is set to be greater than the surface area of a cross section of each of said first wiring structure and second wiring structure severed in an orthogonal direction to the direction of extension thereof.

3. The semiconductor device according to claim 2, wherein each of the first wiring structures, having said plurality of first sub-wiring structures and second sub-wiring structures, includes a first redistribution wiring layer which is electrically connected to one of said circuit element connecting pads, and a first post portion for electrically connecting said first redistribution wiring layer to one of said first external terminals comprising said plurality of first sub-external terminals and second sub-external terminals, and
   each of said plurality of second wiring structures includes a second redistribution wiring layer provided from said first region to said second region and electrically connected to one of said circuit element connecting pads, and a second post portion for electrically connecting said second redistribution wiring layer to one of said plurality of second external terminals.

4. The semiconductor device according to claim 1, wherein each of the first wiring structures, having said plurality of first sub-wiring structures and second sub-wiring structures, includes a first redistribution wiring layer which is electrically connected to one of said circuit element connecting pads, and a first post portion for electrically connecting said first redistribution wiring layer to one of said first external terminals having said plurality of first sub-external terminals and second sub-external terminals, and
   each of said plurality of second wiring structures includes a second redistribution wiring layer provided from said first region to said second region and electrically connected to one of said circuit element connecting pads, and a second post portion for electrically connecting said second redistribution wiring layer to one of said plurality of second external terminals.

5. A semiconductor device comprising:
   a semiconductor substrate having a first region formed with a circuit element and provided with a plurality of circuit element connecting pads to which said circuit element is connected, and a second region surrounding the periphery of said first region;
   a metallic layer provided on said second region;
   an insulating film provided such that a part of said circuit element connecting pads and a part of said metallic layer are exposed;
   a plurality of first wiring structures provided on said insulating film in said first region and electrically connected to said plurality of circuit element connecting pads;
   a plurality of second wiring structures provided on said insulating film from said first region to said second region and electrically connected to said plurality of circuit element connecting pads;
   a plurality of third wiring structures provided on said insulating film in said second region and electrically connected to said exposed metallic layer;
   a sealing portion provided such that a part of said first wiring structures is exposed and such that a part of said second wiring structures and third wiring structures is exposed in said second region;
   a plurality of first external terminals disposed on said first region and connected to said first wiring structures; and
   a plurality of second external terminals disposed on said second region and connected to one or both of said second wiring structures and said third wiring structures.

6. The semiconductor device according to claim 5, wherein the surface area of a cross section of said third wiring structure severed in an orthogonal direction to the direction of extension thereof is set to be greater than the surface area of a cross section of each of said first wiring structure and second wiring structure severed in an orthogonal direction to the direction of extension thereof.

7. The semiconductor device according to claim 6, wherein each of said plurality of first wiring structures includes a first redistribution wiring layer which is electrically connected to one of said circuit element connecting pads, and a first post portion for electrically connecting said first redistribution wiring layer to one of said plurality of first external terminals, and
   each of said plurality of second wiring structures includes a second redistribution wiring layer provided from said first region to said second region and electrically connected to one of said circuit element connecting pads, a third redistribution wiring layer connected to said third wiring structure formed on said second region, and a second post portion for electrically connecting one or both of said second redistribution wiring layer and said third redistribution wiring layer to one of said plurality of second external terminals.

8. The semiconductor device according to claim 5, wherein said metallic layer is formed from an identical material to any one of the first sub-wiring structure, second sub-wiring structure, first wiring structure, second wiring structure, and third wiring structure.

9. The semiconductor device according to claim 5, wherein each of said plurality of first wiring structures includes a first rewiring layer which is electrically connected to one of said circuit element connecting pads, and a first post portion for electrically connecting said first redistribution wiring layer to one of said plurality of first external terminals, and each of said plurality of second wiring structures includes a second redistribution wiring layer provided from said first region to said second region and electrically connected to one of said circuit element connecting pads, a third redistribution wiring layer connected to said third wiring structure formed on said second region, and a second post portion for electrically connecting one or both of said second redistribution wiring layer and said third redistribution wiring layer to one of said plurality of second external terminals.

10. A semiconductor device comprising:

a semiconductor substrate having a first region formed with a circuit element and provided with a plurality of circuit element connecting pads to which said circuit element is connected, and a second region surrounding the periphery of said first region;

a metallic layer provided on said second region;

an insulating film provided such that a part of said circuit element connecting pads and a part of said metallic layer are exposed;

a first wiring structure having a first sub-wiring structure provided on said insulating film in said first region and electrically connected to said plurality of circuit element connecting pads, and a second sub-wiring structure provided on said insulating film in said first region and electrically connected to said plurality of circuit element connecting pads;

a plurality of second wiring structures provided on said insulating film from said first region to said second region and electrically connected to said circuit element connecting pads;

a plurality of third wiring structures provided on said insulating film in said second region and electrically connected to said exposed metallic layer;

a sealing portion provided such that a part of said first sub-wiring structure and said second sub-wiring structure is exposed, and such that a part of said second wiring structure and said third wiring structure in said second region is exposed;

a first external terminal having a plurality of first sub-external terminals disposed on said first region and composed of terminals to be connected to a power source, and a plurality of second sub-external terminals disposed on said first region; and a plurality of second external terminals disposed on said second region and connected to one or both of said second wiring structure and said third wiring structure.

11. The semiconductor device according to claim 10, wherein the surface area of a cross section of said third wiring structure and said first sub-wiring structure severed in an orthogonal direction to the direction of extension thereof is set to be greater than the surface area of a cross section of each of said first wiring structure and second wiring structure severed in an orthogonal direction to the direction of extension thereof.

12. The semiconductor device according to claim 11, wherein each of the first wiring structures, having said plurality of first sub-wiring structures and second sub-wiring structures, includes a first redistribution wiring layer which is electrically connected to one of said circuit element connecting pads, and a first post portion for electrically connecting said first redistribution wiring layer to one of said first external terminals comprising said plurality of first sub-external terminals and second sub-external terminals, and each of said plurality of second wiring structures includes a second redistribution wiring layer provided from said first region to said second region and electrically connected to one of said circuit element connecting pads, a third redistribution wiring layer connected to said third wiring structure formed on said second region, and a second post portion for electrically connecting one or both of said second redistribution wiring layer and said third redistribution wiring layer to one of said plurality of second external terminals.

13. The semiconductor device according to claim 10, wherein said metallic layer is formed from an identical material to any one of the first sub-wiring structure, second sub-wiring structure, first wiring structure, second wiring structure, and third wiring structure.

14. The semiconductor device according to claim 10, wherein each of the first wiring structures, having said plurality of first sub-wiring structures and second sub-wiring structures, comprises a first redistribution wiring layer which is electrically connected to one of said circuit element connecting pads, and a first post portion for electrically connecting said first redistribution wiring layer to one of said first external terminals comprising said plurality of first sub-external terminals and second sub-external terminals, and each of said plurality of second wiring structures includes a second redistribution wiring layer provided from said first region to said second region and electrically connected to one of said circuit element connecting pads, a third redistribution wiring layer connected to said third wiring structure formed on said second region, and a second post portion for electrically connecting one or both of said second redistribution wiring layer and said third redistribution wiring layer to one of said plurality of second external terminals.

* * * * *